United States Patent [19]

Murphy et al.

[11] Patent Number: 4,654,887
[45] Date of Patent: Mar. 31, 1987

[54] RADIO FREQUENCY MIXER

[75] Inventors: Michael T. Murphy, Tyngsboro; William R. Connerney, Needham, both of Mass.

[73] Assignee: Raytheon Company, Lexington, Mass.

[21] Appl. No.: 794,802

[22] Filed: Nov. 4, 1985

[51] Int. Cl.$^4$ .............................................. H04B 1/26
[52] U.S. Cl. .................................. 455/327; 455/302; 455/317; 455/330
[58] Field of Search ................ 455/302, 317, 325–327, 455/330

[56] References Cited

U.S. PATENT DOCUMENTS

| | | | |
|---|---|---|---|
| 3,512,091 | 5/1970 | Blixt et al. | 455/327 |
| 3,659,206 | 4/1972 | Hallford | 455/326 |
| 3,943,450 | 3/1976 | Otremba | 455/327 |
| 4,031,472 | 6/1977 | Shinkawa et al. | 455/327 |
| 4,377,005 | 3/1983 | Marchand et al. | 455/327 |

OTHER PUBLICATIONS

"A New Phased-Type Image Enhanced Mixer" by L. E. Dickens and D. W. Maki, Microwave Symposium Digest, MTT-S 1975, pp. 149–151.
"Phasing Type Image Recovery Mixers" by T. M. Oxley, Microwave Symposium Digest, MTT-S 1980, pp. 270–273.
"Crystal Rectifiers" (Volume 15 of the MIT Radiation Laboratories by M.C. Torrey and C.A. Whitmer, published by McGraw-Hill, New York, 1948.

Primary Examiner—Jin F. Ng
Attorney, Agent, or Firm—Philip J. McFarland; Richard M. Sharkansky

[57] ABSTRACT

A wideband enhancement sum mixer is shown to comprise a pair of matched GaAs diodes operative with a printed circuit wherein a portion of at least the sum signal, i.e., the sum of a radio frequency signal and a local oscillator signal, is caused to be mixed with the second harmonic of the local oscillator signal to produce an intermediate frequency signal in phase with the intermediate frequency signal resulting from mixing of the radio frequency signal and the local oscillator signal.

6 Claims, 2 Drawing Figures

RADIO FREQUENCY MIXER

BACKGROUND OF THE INVENTION

This invention pertains generally to radio frequency (R.F.) mixers and particularly to wideband R.F. mixers.

It is common practice in the radar art to downconvert received radar signals to first intermediate frequency (I.F.) signals by passing such radar signals through an R.F. mixer. One known way of improving mixer conversion loss is to use a so-called image enhancement mixer. Unfortunately, this type of mixer suffers from relatively large conversion losses and is practical only when the first I.F. signal is at a relatively high frequency and the signal bandwidth is relatively narrow. In an enhancement mixer the circuitry of an R.F. mixer may be arranged so that reactive terminations are provided with the final result being that the image signal inherent in any mixing process contributes to the power of the I.F. signals out of such mixer.

In any type of image-enhancement mixers being discussed it is necessary that some sort of filtering be provided so that only the image frequency signals (and not the local oscillator signals) may pass to the reactive terminations. In order to attain the requisite degree of filtering the image and L.O. signals must differ appreciably in frequency, with the resultant effect that the I.F. frequency must be relatively high and the bandwidth of the R.F. mixer be relatively narrow.

Phased-type image enhancement mixers such as those described in articles entitled "A New Phased-Type Image Enhanced Mixer" by L. E. Dickens and D. W. Maki, Microwave Symposium Digest, MTT-S 1975, pages 149–151, and "Phasing Type Image Recovery Mixers" by T. M. Oxley, Microwave Symposium Digest, MTT-S 1980, pages 270–273, obviate the filtering problem presented by conventional image-enhancement mixers. However, such image-enhancement mixers comprise two separate balanced mixers so circuit complexity and the requisite local oscillator (L.O.) power are increased.

SUMMARY OF THE INVENTION

With the foregoing Background of the Invention in mind, it is, therefore, a primary object of this invention to provide an R.F. mixer having a low I.F. output frequency and improved conversion loss.

It is another object of this invention to provide an R.F. mixer having low conversion loss and a wide operating bandwidth.

The foregoing and other objects of this invention are generally attained by providing an R.F. mixer wherein a wideband sum enhancement technique is utilized, such technique involving reactively terminating the sum signal, the second harmonic of the L.O. and the sum image frequency so that the I.F. frequency may be lowered substantially and the bandwidth may be increased.

BRIEF DESCRIPTION OF THE DRAWINGS

Other objects and many of the attendant advantages of the invention will be readily appreciated as the same become better understood by reference to the following detailed description when considered in connection with the accompanying drawings wherein.

DESCRIPTION OF THE PREFERRED EMBODIMENT

Figure 1:
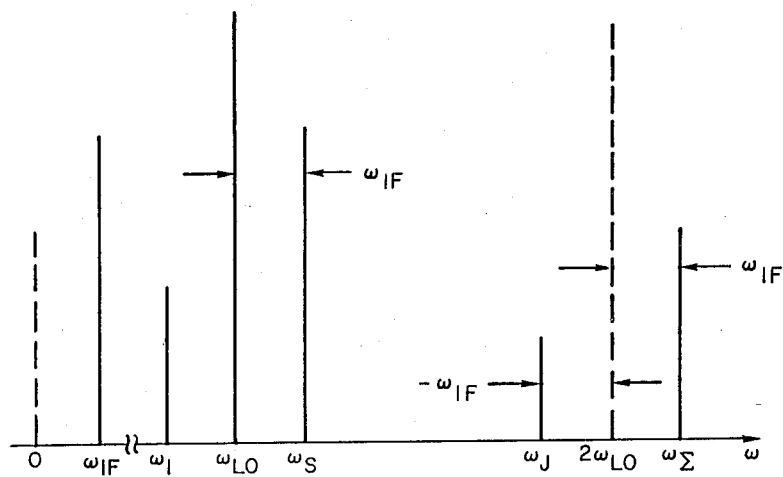
FIG. 1 is a sketch illustrating, for the "small-signal" case, the relative amplitudes and frequency separation between various signals generated in a nonlinear mixing process and used in this invention.

Referring now to FIG. 1, it may be seen that an input signal $\omega_S$ and a local oscillator signal $\omega_{LO}$ form the signals of interest here; namely (1) a desired intermediate frequency signal $\omega_{IF}$ that is the difference between $\omega_S$ and $\omega_{LO}$; (2) a sum signal $\omega_\Sigma$ that is the sum of $\omega_S$ and $\omega_{LO}$; (3) the image $\omega_1$ of the input signal; and (4) the image $\omega_J$ of that is the difference between the second harmonic $2\omega_{LO}$ of $\omega_{LO}$ and $\omega_{IF}$. The second harmonic of $\omega_{LO}$ is shown in broken line. The relative amplitudes of the various signals are qualitatively indicated by the lengths of the lines.

It will be appreciated that if the sum signal $\omega_E$ were to be mixed with the second harmonic $2\omega_{LO}$, the resultant signal $(\omega_\Sigma - 2_{LO})$ would be in phase with the desired intermediate frequency $\omega_{IF}$. It will also be appreciated that if the image $\omega_1$ were to be mixed with the local oscillator signal $\omega_{LO}$ (or if the image $\omega_J$ were to be mixed with the second harmonic $2\omega_{LO}$ of the local oscillator signal $\omega_{LO}$) the frequency of the resultant signal would also be the same as the frequency of the desired intermediate frequency signal $\omega_{IF}$. However, the phase of the resultant signal (if either image were to be mixed with its corresponding local oscillator signal as just indicated) would be displaced by 180° relative to the phase of the desired intermediate frequency signal $\omega_{IF}$.

It is evident from the foregoing that the conversion loss of a mixer may be reduced if some, if not all, of the various signals of interest in addition to the desired intermediate frequency signal $\omega_{IF}$ were to be utilized. Thus, as described by M. C. Torrey and C. A. Whitmer in the text "Crystal Rectifiers" (Volume 15 of the MIT Radiation Laboratories) published by McGraw-Hill, New York, 1948, a technique for utilizing the image $\omega_1$ is described.

Figure 2:
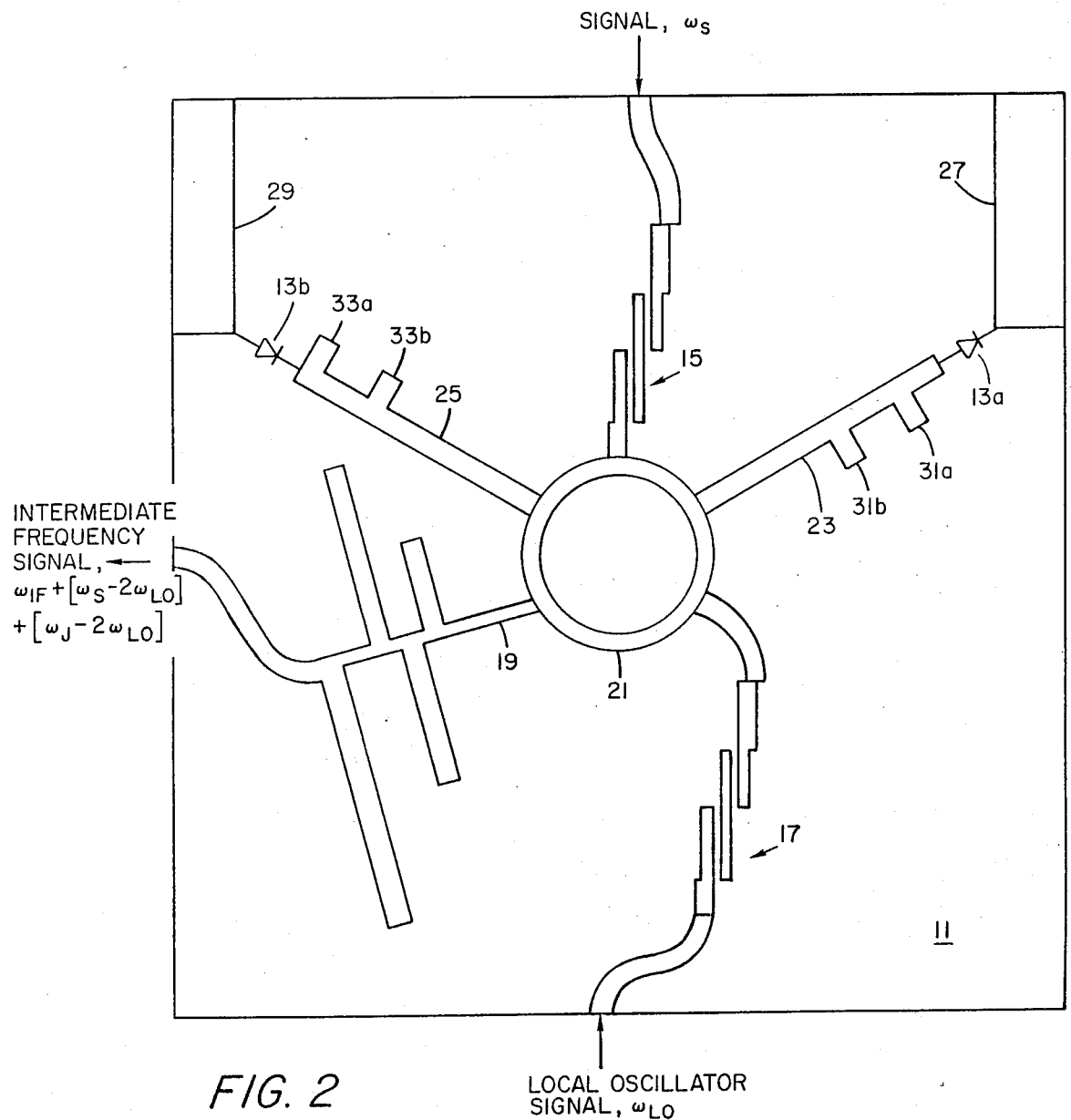
FIG. 2 is a plan view of a wideband sum enhanced mixer according to this invention.

Referring now to FIG. 2, a plan view of a mixer (not numbered) that is effective to utilize the sum signal $\omega_\Sigma$ is shown. In the illustrated embodiment conventional microstrip techniques are used to fabricate the contemplated circuitry on one surface of a substrate 11, here a sheet of alumina. It will be understood that the hidden side of the substrate 11 is covered with a conventional electrically conductive material to form a ground plane. A signal lead 15 and a local oscillator lead 17 are printed as shown to provide signal paths for the signal $\omega_S$ and the local oscillator signal $\omega_{LO}$. It will be noted that each one of the signal and local oscillator leads 15, 17 is segmented in a known manner to form a bandpass filter so that only signals at $\omega_S$ and $\omega_{LO}$ may pass (meaning that signals at $\omega_{IF}$, $2\omega_{LO}$, $\omega_\Sigma$ and $\omega_J$ may not pass) over such leads. The signal lead 15 and the local oscillator lead 17 are terminated at points on a hybrid ring 21. The circumference of the hybrid ring 21 here is equal to $(3/2)\lambda g$ where $\lambda g$ is the wavelength of the signal $\omega_S$. The spacing between the points of termination on the hybrid ring 21 of the signal lead 15 and the local oscillator lead 17 is $\lambda g/2$. A first branch lead 23 is terminated at a point on the hybrid ring 21 midway between the signal lead 15 and the local oscillator lead 17 and a second branch lead 25 is terminated at a point on the hybrid ring 21 diametrically opposite the point of termination of the local oscillator lead 17. An intermediate frequency lead 19 here is terminated at any convenient point on the hybrid ring 21. A radio frequency choke (not numbered) is formed on the intermediate frequency lead 19. The characteristic impedance of the hybrid ring 21 here is 70.7 ohms and the characteristic impedance of each one of the signal lead 15, the local oscillator lead 17, the first branch lead 23 and the second branch lead 25 is 50 ohms. It follows, therefore, that the signal $\omega_S$ is divided equally between the first branch lead 23 and the second branch lead 25 and that the signal $\omega_{LO}$ is similarly divided. It is noted here in passing that the connection of the intermediate frequency lead 19 to the hybrid ring 21 may, under some circumstances, cause imbalances that result in some degradation in the division of the radio frequency signals ($\omega_S$ and $\omega_{LO}$). However, in the interest of simplicity and ease of fabrication, the direct connection of the intermediate frequency lead 19 to the hybrid ring 21 is here illustrated as the preferred method of coupling the desired intermediate frequency signals out of the mixer.

A diode 13a is connected as shown between the free end of the first branch lead 23 and a pad 27 and a diode 13b is connected as shown between the free end of the second branch lead 25 and a pad 29. It should be noted that the cathode of diode 13a is grounded and that the anode of diode 13b is grounded. Diode 13a is sometimes referred to as a noninverting diode and diode 13b is sometimes referred to as an inverting diode. The pads 27, 29 are connected in any convenient manner directly to the ground plane (not shown) on the hidden side of the substrate 11. The diodes 13a, 13b here are "beam lead" devices so the requisite connections may be effected by a conventional thermal compression technique. The connection between each one of the pads 27, 29 and the ground plane (not shown) here is effected by a bridge (not shown) of electrically conductive material on the narrow sides (not shown) of the substrate 11, each such bridge being formed when the circuitry being described is formed.

The diodes 13a, 13b preferably are a matched pair of gallium-arsenide (GaAs) Schottky barrier devices having, say, a voltage standing wave ratio (VSWR) of less than 1.6 to 1 at 10 GHz and 5 milliwatts. Because the parasitic shunt capacitance of GaAs diodes is very low, the signals of interest here around the second harmonic $2\omega_{LO}$, i.e., the sum signal $\omega_\Sigma$ and the image $\omega_J$ of the sum signal $\omega_\Sigma$ may be utilized.

To accomplish utilization of the sum signal $\omega_\Sigma$, a so-called "wide-band sum enhancement filter" (not numbered) is provided on each one of the first and the second branch leads 23, 25. Thus, stubs 31a, 31b (each electrically equal in length to $(\lambda_\Sigma)/4$, where $(\lambda_\Sigma)$ is the wavelength of the sum signal) are formed at $(\lambda_\Sigma)/2$ intervals along the first branch lead 23, with stub 31a being spaced at a distance equal to $(\lambda_\Sigma)/4$ from the diode 13a. In like fashion, stubs 33a, 33b (which are identical to stubs 31a, 31b) except that stub 33a is spaced at a distance of $(\lambda_\Sigma)/2$ from the diode 13b) are formed. It should be noted that in determining the actual length of each one of the stubs 31a, 31b, 33a, 33b, the effect of the fringe field around each stub must be considered. As is known, the fringe field around each stub causes an increase in electrical length so the actual length of each stub is appropriately adjusted so that each stub appears to the sum signal $\omega_\Sigma$ to be one-fourth wavelength long. It will be appreciated that the nonlinear action of the diodes 13a, 13b causes the second harmonic signal $2_{LO}$ to be generated along with the sum signal $\omega_\Sigma$ and the sum image signal $\omega_J$. A portion of each one of the latter two signals, after traversing along the branch line 23 (or 25) and the stubs 31a, 31b (or 33a, 33b) is reflected back to the diode 13a (or 13b) to be mixed with the second harmonic signal $2\omega_{LO}$. As a result of such mixing of the second harmonic signal $2_{LO}$ with the reflected portion of the sum signal $\omega_\Sigma$ the resultant signal $(\omega_\Sigma - 2_{LO})$ is generated; similarly, the mixing of the reflected portion of the sum image signal $\omega_J$ produces the resultant signal $(\omega_J - 2\omega_{LO})$. As noted previously, the resultant signal $(\omega_\Sigma - 2\omega_{LO})$ is in phase with the intermediate frequency signal $(\omega_S - \omega_{LO})$ and the resultant signal $(\omega_J - 2\omega_{LO})$ is in antiphase to the intermediate frequency signal $(\omega_S - \omega_{LO})$. The signal $\omega_S$ and the local oscillator signal $\omega_{LO}$ are not affected by the wideband sum enhancement filter (not numbered), but the second harmonic signal $2\omega_{LO}$, the sum signal $\omega_\Sigma$ and the sum image signal $\omega_J$ are reactively terminated. The amplitude of the resultant signal $(\omega_\Sigma - 2\omega_{LO})$ is greater than the amplitude of the resultant signal $(\omega_J - 2\omega_{LO})$. It follows, then, that the intermediate frequency signal out of the described mixer, i.e., $(\omega_S - \omega_{LO}) + (\omega_\Sigma - 2\omega_{LO}) + (\omega_J - 2\omega_{LO})$, is greater than a mixer that utilizes only the signals $\omega_S$ and $\omega_{LO}$. It also follows that if provision were made to invert the phase of the resultant signal $(\omega_J - 2\omega_{LO})$, the output of the described mixer could be increased more. However, simplicity would be sacrificed and the signal bandwidth would be decreased.

It should be noted that the signal bandwidth of the described mixer is limited by the bandwidth of each one of the components, i.e., the bandpass filters 15, 17, the hybrid ring 21 and the enhancement filters (not numbered). Here, however, at X-band the bandwidth of each one of the components may easily be made to be about 20% of the sum signal $2\omega_\Sigma$.

The contemplated wideband sum enhancement technique is intended for use in mixers when a low I.F. frequency relative to the signal frequency is desired (i.e., $\omega_{IF} = 0.05 \omega_{LO}$). In such applications, a 1 dB improvement in mixer conversion loss has been demonstrated utilizing the contemplated wideband sum enhancement technique. While this improvement in conversion loss is not as great as that that can be obtained utilizing the more complex image enhancement techniques, it does represent a significant improvement that can be realized with a minimum of complexity.

Having described an embodiment of the invention, it will now be apparent to one of skill in the art that changes could be made without departing from the inventive concepts. For example, a second set of enhancement filters could be disposed along the branch lines to correct the phase of the sum image signal $\omega_J$. It is felt, therefore, that this invention should not be restricted to its disclosed embodiment, but rather should be limited only by the spirit and scope of the appended claims.

What is claimed is:

1. A balanced mixer wherein a matched pair of gallium arsenide diodes is disposed to produce an intermediate frequency signal equal in frequency to the difference, $\omega_{I.F.}$, between the frequency of a radio frequency signal and the frequency of a local oscillator signals, such mixer comprising:

(a) a hydrid ring havng a first and a second input lead and a first and a second branch arm, the circumference of the hybrid ring being equal to $3\lambda_S/2$, where $\lambda_S$ is the wavelength, in the balanced mixer, of the radio frequency signal, the first and second input leads and the first and second branch arms being connected to the hybrid ring at points such that the radio frequency signal and the local oscillator signal, when connected respectively to the first and the second input leads, divide equally between the first and the second branch arms;

(b) a first and a second gallium arsenide diode connected, respectively, between a free end of each one of the branch arms and ground, each one of such diodes generating at a first signal having a frequency of $2\omega_{LO}$, a second signal having a frequency of $\omega_\Sigma$, where $\omega_{LO}$ is the frequency of a local oscillator signal and $\omega_\Sigma$ is the sum of $\omega_{LO}$ and the frequency of the radio frequency signal, and a third signal at a frequency of $\omega_{I.F.}$, the first, the second and the third signal being directed over printed circuits toward the hybrid ring; and (c) means along the printed circuit for redirecting a portion of the second signal back through each one of the gallium aresenide diodes in phase with the first signal to produce a fourth signal at a frequency of $\omega_{I.F.}$ and in phase with the third signal, the sum of the third and the fourth signals being the intermediate frequency signal.

2. The balanced mixer as in claim 1 wherein the means for redirecting comprises:

at least one quarter-wave stub affixed to each one of the branch arms, the electrical length of each one of such stubs being equal to $\lambda_\Sigma/4$, where $\lambda_\Sigma$ is the wavelength, in the balanced mixer, of the second signal, the point of attachment on the branch arm of each such stub being removed from each gallium arsenide diode by $N(\lambda_\Sigma/4)$ wavelengths, where N is an even integer for one of such diodes and an odd integer for the other.

3. The balanced mixer as in claim 2 wherein the gallium arsenide diodes are oppositely poled.

4. The balanced mixer as in claim 3 having, additionally, a first and a second bandpass filter disposed in series with the first and the second input leads.

5. The balanced mixer as in claim 4 having, additionally:

(a) an output lead connected to a selected point on the hybrid ring; and (b) low pass filter means in circuit with the output lead.

6. The balanced mixer as in claim 5 wherein the input leads, the bandpass filters, the hybrid ring, the branch leads, the at least one quarter-wave stub, the output lead and the low pass filter means are fabricated as a printed circuit.

* * * * *